US007150956B2

(12) United States Patent
Nitta et al.

(10) Patent No.: US 7,150,956 B2
(45) Date of Patent: Dec. 19, 2006

(54) CHEMICAL AMPLIFICATION TYPE POSITIVE RESIST COMPOSITION, RESIST LAMINATED MATERIAL, RESIST PATTERN FORMING METHOD AND METHOD OF MANUFACTURING SEMICONDUCTOR DEVICE

(75) Inventors: Kazuyuki Nitta, Ebina (JP); Takeyoshi Mimura, Koza-gun (JP); Satoshi Shimatani, Yokohama (JP); Waki Okubo, Koza-gun (JP); Tatsuya Matsumi, Sagamihara (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 146 days.

(21) Appl. No.: 11/028,456

(22) Filed: Jan. 3, 2005

(65) Prior Publication Data

US 2005/0112498 A1 May 26, 2005

Related U.S. Application Data

(63) Continuation of application No. 10/362,855, filed on Feb. 26, 2003.

(30) Foreign Application Priority Data

| | | |
|---|---|---|
| Jun. 28, 2001 | (JP) | 2001-196069 |
| Aug. 7, 2001 | (JP) | 2001-239110 |
| Oct. 12, 2001 | (JP) | 2001-316025 |
| Nov. 13, 2001 | (JP) | 2001-347737 |
| Jun. 28, 2002 | (WO) | PCT/JP02/06557 |

(51) Int. Cl.
*G03F 7/004* (2006.01)
*G03F 7/30* (2006.01)

(52) U.S. Cl. .................. 430/170; 430/270.1; 430/313; 430/317; 430/324; 430/326; 430/905; 438/781

(58) Field of Classification Search ................ 430/170, 430/270.1, 326, 905, 313, 317, 324; 438/778, 438/780, 781, 782
See application file for complete search history.

(56) References Cited

U.S. PATENT DOCUMENTS

| | | | |
|---|---|---|---|
| 5,468,589 | A | 11/1995 | Urano et al. |
| 5,558,971 | A | 9/1996 | Urano et al. |
| 5,670,299 | A | 9/1997 | Urano et al. |
| 5,750,309 | A | 5/1998 | Hatakeyama et al. |
| 5,876,900 | A | 3/1999 | Watanabe et al. |
| 6,117,621 | A | 9/2000 | Hatakeyama et al. |
| 6,159,652 | A | 12/2000 | Sato et al. |
| 6,319,815 | B1 | 11/2001 | Iguchi et al. |
| 6,444,394 | B1 | 9/2002 | Sato et al. |
| 6,613,836 | B1 | 9/2003 | Rumack |
| 6,656,660 | B1 | 12/2003 | Urano |
| 6,693,049 | B1 | 2/2004 | Iguchi et al. |
| 6,716,573 | B1 | 4/2004 | Fujie et al. |
| 6,743,562 | B1 | 6/2004 | Momota et al. |

FOREIGN PATENT DOCUMENTS

| | | |
|---|---|---|
| JP | 05-249682 A | 9/1993 |
| JP | 8015864 | 1/1996 |
| JP | 08-123032 A | 5/1996 |
| JP | 8262721 | 10/1996 |
| JP | 09-90639 | 4/1997 |
| JP | 09-160246 | 6/1997 |
| JP | 09-211868 | 8/1997 |
| JP | 09-311452 | 12/1997 |
| JP | 10-326017 | 12/1998 |
| JP | 11095434 | 4/1999 |
| JP | 2000-267283 | 9/2000 |
| JP | 2001-085518 | 3/2001 |
| JP | 2001-102449 | 4/2001 |
| JP | 2001-168188 | 6/2001 |
| JP | 2001-176842 | 6/2001 |

OTHER PUBLICATIONS

K.K. Realize, "Recent Developments in Cu Wiring Technology", *Outline of the Total Process: Present State and Problems of Dual-damascene Cu Wiring*, pp. 202-205 (1998).

*Primary Examiner*—John S. Chu
(74) *Attorney, Agent, or Firm*—Hoffmann & Baron, LLP

(57) ABSTRACT

The present invention provides a resist composition comprising (A) polyhydroxystyrene in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, and also provides a chemical amplification type positive resist composition which contains polyhydroxystyrene in which at least a portion of hydrogen atoms of hydroxyl groups are substituted with a lower alkoxy-alkyl group having a straight-chain or branched alkoxy group, and the solubility in an alkali solution of the polyhydroxystyrene increasing when the lower alkoxy-alkyl group is eliminated by an action of an acid, in place of the component (A).

15 Claims, No Drawings

CHEMICAL AMPLIFICATION TYPE POSITIVE RESIST COMPOSITION, RESIST LAMINATED MATERIAL, RESIST PATTERN FORMING METHOD AND METHOD OF MANUFACTURING SEMICONDUCTOR DEVICE

CROSS-REFERENCE TO RELATED APPLICATION

This application is a continuation of co-pending application Ser. No. 10/362,855, filed on Feb. 26, 2003, which is hereby incorporated by reference.

TECHNICAL FIELD

The present invention relates to a chemical amplification type positive resist composition which can yield a high-resolution resist pattern capable of coping with fine patterns required to the manufacture of semiconductor devices by a via-first dual damascene method.

BACKGROUND ART

In accordance with recent developments of higher integration of semiconductor devices, mass production of LSI with a design rule of about 0.20 μm has already started and mass production of LSIs with a design rule of about 0.15 μm will be realized in the near future.

In addition, a chemical amplification type positive resist composition is superior in resolution and sensitivity to a conventional non-chemical amplification type positive resist composition using a novolak resin as a base resin and a naphthoquinonediazide sulfonate ester as a photosensitive agent. Therefore, the conventional non-chemical amplification type positive resist composition has recently been replaced by the chemical amplification type positive resist composition.

At present, it is popular to employ chemical amplification type positive resist compositions which use, as a base resin, a copolymer or mixed resin, wherein an acetal group, which is dissociated with a comparatively weak acid, and an acid-dissociable group such as tert-butoxycarbonyl group, tert-butyl group or tetrahydropyranyl group, which is not easily dissociated with a weak acid but is dissociated with a strong acid, coexist and also use a sulfonyldiazomethane acid generating agent as an acid generating agent (Japanese Patent Application, First Publication No. Hei 8-15864, Japanese Patent Application, First Publication No. Hei 8-262721, Japanese Patent Application, First Publication No. Hei 9-160246, Japanese Patent Application, First Publication No. Hei 9-211868, Japanese Patent Application, First Publication No. Hei 9-274320 and Japanese Patent Application, First Publication No. Hei 9-311452).

As prior art known before the above techniques are laid open to public, for example, there are those using a copolymer of p-(1-ethoxyethoxy)styrene and p-hydroxystyrene as a base resin and a sulfonyldiazomethane acid generating agent such as bis(cyclohexylsulfonyl)diazomethane as an acid generating agent (Japanese Patent Application, First Publication No. Hei 5-249682). Such a resist composition containing a combination of an acetal (alkoxy-alkyl) group, which is dissociated with a comparatively weak acid, as a dissolution inhibiting group and a sulfonyldiazomethane compound capable of generating a weak acid forms a resist pattern having high resolution. However, the resist pattern formed from the resist composition tends to narrow over time and are not satisfactory because of insufficient heat resistance and dependence on a substrate. Therefore, as described above, there was proposed a technique whose drawbacks were solved by the base resin wherein the acetal group, which is dissociated with the comparatively weak acid, and the acid-dissociable group, which is dissociated with the strong acid, coexist.

With improvements in semiconductor devices, a conventional method of forming Al wiring using a reactive ion etching (RIE) technique is already being replaced by a method of forming Al.Cu wiring or Cu wiring using a damascene technique in the semiconductor device manufacturing process.

It is expected that the damascene method will become popular in the process for manufacturing semiconductors of the next generation or the subsequent generation.

In the damascene technique, a method of forming two kinds of portions to be etched such as via holes and wiring grooves is referred to as a dual damascene method.

In the dual damascene method, two kinds of a trench-first technique of previously forming wiring grooves and a via-first technique of previously forming via holes exist ("Latest Developments in Cu Wiring Techniques", pages 202 to 205, May 30, 1998, published by Realize Co., Ltd.; edited by Katsuro FUKAMI).

In the via-first method of manufacturing semiconductor devices, for example, a base material obtained by laminating a first interlaminar insulating layer, an etching stopper layer and a second interlaminar insulating layer in order on a substrate is prepared. Then, a chemical amplification type positive resist composition is applied on the base material and the coated base material is subjected to exposure in accordance with a predetermined pattern, thereby to make the exposed portion alkali-soluble. The exposed portion is removed with an alkali developing solution and the lower layer with no resist pattern is etched to form via holes which penetrate the first interlaminar insulating layer, the etching stopper layer and the second interlaminar insulating layer. Then, the chemical amplification type positive resist composition is further applied and the coated one is subjected to exposure, thereby to make the exposed portion alkali-soluble. The exposed portion is removed with an alkali developing solution and the lower layer with no resist pattern is etched to widen the groove width of the via holes formed on the second interlaminar insulating layer, thereby to form wiring grooves. Finally, copper, or copper and aluminum are embedded in via holes formed on the first interlaminar insulating layer and the etching stopper layer as well as wiring grooves formed in the second interlaminar insulating layer thereon, thereby to complete wiring having generally T-shaped cross sectional profile.

However, the via-first dual damascene method of forming wiring grooves after forming via holes had a drawback that resist residue is likely to be produced in the vicinity of the upper portion (the bottom portion of wiring grooves of the second interlaminar insulating layer) of via holes as a result of poor development when a resist pattern is formed using the above chemical amplification type positive resist composition using a base resin wherein an acid-dissociable dissolution inhibiting group, which is easily dissociated with a comparatively weak acid, and an acid-dissociable dissolution inhibiting group, which is not easily dissociated with a weak acid but is dissociated with a strong acid, coexist. As a result, there arises a problem that an expected fine pattern cannot be formed.

SUMMARY OF THE INVENTION

Under these circumstances, the present invention has been made, and an object thereof is to provide a chemical amplification type positive resist composition which can give a high-resolution resist pattern capable of coping with a fine pattern required for the manufacture of semiconductor devices by a via-first dual damascene method without producing resist residue, a resist pattern forming method, and a method of manufacturing a semiconductor device using the same.

The present inventors have intensively studied to achieve the above object and found that a resist pattern having high resolution, high sensitivity and less resist residue can be obtained by using a chemical amplification type positive resist composition comprising polyhydroxystyrene in which at least a portion of hydrogen atoms of hydroxyl groups are substituted with an acid-dissociable dissolution inhibiting group and a retention rate of the acid-dissociable dissolution inhibiting group after a dissociation test using hydrochloric acid is 40% or less, and a component capable of generating an acid by irradiation with radiation. Thus, a first chemical amplification type positive resist composition of the present invention has been completed.

That is, the first chemical amplification type positive resist composition of the present invention comprises the following components (A) and (B):

(A) polyhydroxystyrene in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less.

Also the present inventors have found that a resist pattern having excellent cross sectional profile can be obtained without producing resist residue by using a chemical amplification type positive resist composition comprising polyhydroxystyrene in which at least a portion of hydrogen atoms of hydroxyl groups are substituted with a lower alkoxy-alkyl group having a straight-chain or branched alkoxy group and the lower alkoxy-alkyl group is eliminated by an action of an acid, and the solubility in an alkali solution of the polyhydroxystyrene increasing when elimination occurs, and a component capable of generating an acid by irradiation with radiation, wherein two or more kinds of mutually different lower alkoxy-alkyl groups are used as the lower alkoxy-alkyl group of the component. Thus, the second chemical amplification type positive resist composition of the present invention has been completed based on this finding.

The second chemical amplification type positive resist composition of the present invention comprises the following components (A) and (B):

(A) polyhydroxystyrene in which at least a portion of hydrogen atoms of hydroxyl groups are substituted with a lower alkoxy-alkyl group having a straight-chain or branched alkoxy group and the lower alkoxy-alkyl group is eliminated by an action of an acid, and the solubility in an alkali solution of the polyhydroxystyrene increasing when elimination occurs, and (B) a component capable of generating an acid by irradiation with radiation, wherein two or more kinds of mutually different lower alkoxy-alkyl groups are used as the lower alkoxy-alkyl group of the component (A).

The present invention provides a resist laminated material comprising a base material obtained by laminating a first interlaminar insulating film layer, an etching stopper layer and a second interlaminar insulating layer in sequence, and a coating layer of the first or second chemical amplification type positive resist composition provided on the base material.

Also the present invention provides a resist pattern forming method, which comprises applying a chemical amplification type positive resist composition on a base material and subjecting the coated base material to selective exposure and development in sequence to form a resist pattern, wherein the chemical amplification type positive resist composition is the first or second chemical amplification type positive resist composition.

Also the present invention provides a method of manufacturing a semiconductor device using a via-first dual damascene method of forming via holes on a base material and forming wiring grooves at the upper portion, which comprises forming at least the wiring grooves by the resist pattern forming method.

DETAILED DESCRIPTION OF THE INVENTION

The chemical amplification type positive resist composition of the present invention will now be described in detail by way of examples.

(1) First Chemical Amplification Type Positive Resist Composition

In the present invention, as the chemical amplification type positive resist composition, a chemical amplification type positive resist composition comprising:

(A) polyhydroxystyrene (base resin) in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation (acid generating agent) is used.

(i) Re: Component (A)

The component (A) is characterized in that the retention rate of the acid-dissociable dissolution inhibiting group after a dissociation test using hydrochloric acid is 40% or less, and preferably 30% or less.

The dissociation test using hydrochloric acid is conducted in the following procedure. That is, 10 parts by weight of hydrochloric acid having a concentration of 10% by weight is added to 100 parts by weight of a 10 wt % propylene glycol monomethyl ether acetate solution of the component (A) maintained at a liquid temperature of 23° C. and, after stirring for 10 minutes, an acid-dissociable dissolution inhibiting group is dissociated. Then, the substitution rate of the acid-dissociable dissolution inhibiting group before and after an acid treatment is measured by a $^{13}$C-NMR method and the retention rate is determined from the measured value by the following equation.

$$\text{Retention rate (\%)} = \frac{\text{substitution rate after acid treatment}}{\text{substitution rate before acid treatment}} \times 100$$

It is defined that the retention rate exceeds 40% in the mixture of the component in which the retention rate of the acid-dissociable dissolution inhibiting group is 40% or less and the component in which the retention rate of the acid-dissociable dissolution inhibiting group exceeds 40%. One, two or more kinds each having a different retention rate can be used in combination as the component (A). However, when the component in which the retention rate exceeds 40% is contained in a large amount, resist residue cannot be prevented and, therefore, it is disadvantageous.

Therefore, the component in which the retention rate exceeds 40% may be contained in a very small amount as far as the operation and effect of the present invention are not adversely affected. It is preferred that the component (A) be substantially composed only of the component or components having the retention rate of 40% or less.

As described above, it is necessary to use the component (A) having a small retention rate in order to prevent resist residue. Therefore, it is necessary to use the component (A) which is substantially free from an acid-dissociable dissolution inhibiting group which is dissociated only with a strong acid (for example, an acid-dissociable dissolution inhibiting group which is not easily dissociated as compared with a lower alkoxy-alkyl group).

As described in the BACKGROUND ART, in a chemical amplification type positive resist composition which has conventionally been put into practice, polyhydroxystyrene having both an acid-dissociable dissolution inhibiting group which can be dissociated even with a comparatively weak acid and an acid-dissociable dissolution inhibiting group which is dissociated only with a strong acid was used as the base resin.

In contrast, in the present invention, the acid-dissociable dissolution inhibiting group which is dissociated only with a strong acid is substantially excluded. The component having the acid-dissociable dissolution inhibiting group which is dissociated only with a strong acid cannot satisfy such an essential constitution of the present invention that the retention rate of the acid-dissociable dissolution inhibiting group after the dissociation test using hydrochloric acid is 40% or less, and thus resist residue is likely to be produced.

The acid-dissociable dissolution inhibiting group which is dissociated only with a strong acid is, for example, an acid-dissociable dissolution inhibiting group which is not easily dissociated as compared with a lower alkoxy-alkyl group. Specific examples thereof include tertiary alkyloxycarbonyl group, tertiary alkyl group and cyclic ether group. More specifically, tert-butoxycarbonyloxy group, tert-butyl group and tetrahydropyranyl group are listed.

The component (A) includes, for example, polyhydroxystyrene comprising:

($a_1$) a hydroxystyrene unit, and ($a_2$) a unit in which at least a portion of hydrogen atoms of hydroxyl groups of hydroxystyrene are substituted with an acid-dissociable dissolution inhibiting group and the acid-dissociable dissolution inhibiting group is only a lower alkoxy-alkyl group, or a combination of the lower alkoxy-alkyl group and a group which is easily dissociated as compared with the lower alkoxy-alkyl group.

The unit ($a_1$) is a unit which imparts alkali solubility and adhesion to the substrate and is derived through cleavage of an ethylenic double bond of hyroxystyrene or hydroxy a-methylstyrene. The position of the hydroxy group may be the o-position, m-position or p-position, and most preferably the p-position in view of availability and low cost.

The unit ($a_2$) is a portion which makes the component (A) alkali-soluble from alkali-insoluble by exposure.

When the chemical amplification type positive resist composition applied on the base material is irradiated with predetermined radiation, an acid is generated from an acid generating agent as the component (B) and the acid-dissociable dissolution inhibiting group of the unit ($a_2$) is eliminated by an action of the acid, and thus the eliminated portion is converted into a phenolic hydroxyl group. As a result, the component (A), which was alkali-insoluble before the exposure, is made to be alkali-soluble after the exposure.

As described above, the lower alkoxy-alkyl group is a preferable acid-dissociable dissolution inhibiting group which satisfies the constitution of the retention rate of 40% or less in the component (A). Specific examples thereof include 1-ethoxyethyl group, 1-methoxy-1-methylethyl group, 1-isopropoxyethyl group, 1-methoxypropyl group and 1-n-butoxyethyl group.

The component (A) may contain a copolymerizable unit other than the units ($a_1$) and ($a_2$), and is preferably composed of the units ($a_1$) and ($a_2$) in view of suppression of resist residue.

The component (A) may be, for example, a resin having only a lower alkoxy-alkyl group as the acid-dissociable dissolution inhibiting group, namely, a polymer in which a portion of hydrogen atoms of hydroxyl groups of polyhydroxystyrene are substituted with only a lower alkoxy-alkyl group.

Also it may be a mixture of two or more kinds of polyhydroxystyrenes in which a portion of hydrogen atoms of hydroxyl groups of polyhydroxystyrene are substituted with different lower alkoxy-alkyl groups.

The weight-average molecular weight of the component (A) is preferably within a range from 3000 to 30000, and more preferably from 5000 to 15000. When the weight-average molecular weight is less than 3000, the resulting composition is inferior in film-forming properties. On the other hand, when it exceeds 30000, it becomes difficult to dissolve in an alkali solution, particularly an aqueous alkali solution.

Also 10 to 60%, preferably 15 to 50%, of hydrogen atoms of hydroxyl groups in polyhydroxystyrene are preferably substituted with an acid-dissociable dissolution inhibiting group. When the proportion is less than 10%, the dissolution in the alkali solution, particularly the aqueous alkali solution, is not sufficiently suppressed. On the other hand, when it exceeds 60%, it becomes difficult to dissolve in the alkali solution, particularly the aqueous alkali solution.

Specifically the component (A) is preferably polyhydroxystyrene having a weight-average molecular weight within a range from 3000 to 30000 and a dispersion degree (number-average molecular weight/weight-average molecular weight) within a range from 1.0 to 6.0 in which 10 to 60% of hydrogen atoms of hydroxyl groups of polyhydroxystyrene are substituted with a 1-ethoxyethyl group or 1-isopropoxyethyl group because of excellent resolution and excellent resist pattern profile.

Particularly, in order to prevent trailing of the resist pattern and to achieve high resolution, it is preferred to use a mixture obtained by mixing polyhydroxystyrene in which hydrogen atoms are substituted with the 1-ethoxyethyl group and polyhydroxystyrene in which hydrogen atoms are substituted with the 1-isopropoxyethyl group in a weight ratio within a range from 1:9 to 9:1, and preferably from 5:5 to 1:9. When using the component (A) with such a composition, the alkali solubility is easily enhanced by irradiation with radiation and a problem such as resist residue can be accurately solved.

(ii) Re: Component (B)

The component (B) is not specifically limited as long as it is capable of generating an acid by exposure. For example, a sulfonyldiazomethane acid generating agent, an onium salt acid generating agent and an oxime sulfonate acid generating agent can be used.

Examples of the onium salt acid generating agent include trifluoromethane sulfonate or nonafluorobutane sulfonate of bis(4-tert-butylphenyl)iodonium; trifluoromethane sulfonate or nonafluorobutane sulfonate of triphenyl sulfonium; trifluoromethane sulfonate or nonafluorobutane sulfonate of dimethylmonophenyl sulfonium; trifluoromethane sulfonate or nonafluorobutane sulfonate of monomethyldiphenyl sulfonium; and trifluoromethane sulfonate or nonafluorobutane sulfonate of 4-tert-butoxycarbonylmethyloxyphenyldiphenyl sulfonium.

Examples of the oxime sulfonate acid generating agent include a-(methylsulfonyloxyimino)-phenylacetonitrile, a-(methylsulfonyloxyimino)-4-methoxyphenylacetonitrile, a-(trifluoromethylsulfonyloxyimino)-4-methoxyphenylacetonitrile, a-(propylsulfonyloxyimino)-4-methylphenylacetonitrile, a-(methylsulfonyloxyimino)-4-bromophenylacetonitrile, and a compound represented by the following chemical formula (1):

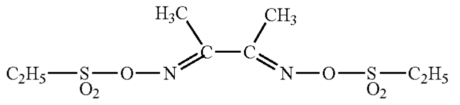

(1)

Examples of the sulfonyldiazomethane acid generating agent include bisalkylsulfonyldiazomethane having a straight-chain or branched alkyl group, such as bis(n-propylsulfonyl)diazomethane, bis(isopropylsulfonyl)diazomethane, bis(n-butylsulfonyl)diazomethane, bis(isopropylsulfonyl)diazomethane and bis(tert-butylsulfonyl) diazomethane.

These components (B) may be used alone, or two or more kinds of them may be used in combination.

Among these compounds, bisalkylsulfonyldiazomethane having a straight-chain or branched $C_{1-4}$ alkyl group is preferred in view of the transparency, proper acidity and alkali solubility.

Furthermore, bis(isopropylsulfonyl)diazomethane, bis (tert-butylsulfonyl)diazomethane or a mixture thereof is preferred because a resist pattern having high resolution can be obtained and resist residue is suppressed.

When using bisalkylsulfonyldiazomethane as the component (B), in case the component (B) contains bisalkylsulfonyldiazomethane as a main component and further contains an onium salt in the amount within a range from 2 to 5% by weight of based on bisalkylsulfonyldiazomethane, higher resolution can be achieved and, therefore, it is preferred.

The onium salt is preferably trifluoromethane sulfonate or nonafluorobutane sulfonate of bis(4-tertbutylphenyl)iodonium.

The amount of the component (B) is within a range from 0.5 to 30 parts by weight, and preferably from 1 to 10 parts by weight, based on 100 parts by weight of the component (A). When the amount is less than 0.5 parts by weight, formation of the pattern is not sufficiently conducted at times. On the other hand, when the amount exceeds 30 parts by weight, it is difficult to obtain a uniform solution and the storage stability is likely to be lowered.

(iii) Re: Other Components

If necessary, the chemical amplification type positive resist composition can contain other components, in addition to the components (A) and (B).

Examples of the other component, which can be added, include known additives, for example, organic amines which exert an action of improving the stability over time (post-exposure stability of the latent image formed by the pattern-wise exposure of the resist layer) and preventing excess diffusion of the acid; organic carboxylic acids which exert an action of improving the sensitivity of the resist composition, thereby to eliminate the dependency on the substrate; anti-halation agents; and surfactants for prevention of striation.

As the organic amine, for example, a secondary or tertiary aliphatic amine such as trimethylamine, diethylamine, triethylamine, di-n-propylamine, tri-n-propylamine, tripentylamine, diethanolamine or triethanolamine is used. Particularly, a tertiary aliphatic amine such as trialkylamine or trialkanolamine is preferred because of high addition effects.

These organic amines can be used alone, or two or more kinds of them can be used in combination. The organic amine is commonly used in an amount within a range from 0.01 to 5% by weight based on the component (A). When the amount is less than 0.01% by weight, it is difficult to obtain the addition effect. On the other hand, when the amount exceeds 5% by weight, the sensitivity is lowered.

As the organic carboxylic acid, for example, aliphatic carboxylic acid such as acetic acid, citric acid, succinic acid, malonic acid or maleic acid; and aromatic carboxylic acid such as benzoic acid or salicylic acid are used.

These organic carboxylic acids may be used alone, or two or more kinds of them may be used in combination. The organic carboxylic acid is commonly used in the amount within a range from 0.01 to 5% by weight based on the component (A). When the amount is less than 0.01% by weight, it is difficult to obtain the addition effect. On the other hand, when the amount exceeds 5% by weight, the effect does not increase.

(iv) Form of Chemical Amplification Type Positive Resist Composition Used to Form a Resist Pattern The chemical amplification type positive resist composition is used to form a resist pattern in the form of a coating solution prepared by dissolving the components (A) and (B) and optionally added addition components in an organic solvent.

The organic solvent used to form the coating solution is not specifically limited as long as it can dissolve the components (A) and (B) to form a uniform solution, and one, two or more kinds selected from those, which have been conventionally known as the solvent of the chemical amplification type resist, can be used.

Specific examples of the organic solvent include:

ketones such as acetone, methyl ethyl ketone, cyclohexanone, methyl isoamyl ketone and 2-heptanone;

derivatives of polyhydric alcohols, such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether or monophenyl ether of dipropylene glycol monoacetate;

cyclic ethers of dioxane; and esters such as methyl lactate, ethyl lactate, methyl acetate, ethyl acetate, butyl acetate, methyl pyruvate, ethyl pyruvate, methyl methoxypropionate and ethyl ethoxypropionate.

(2) Second Chemical Amplification Type Positive Resist Composition (i) Re: Component (A)

As the lower alkoxy-alkyl group of the component (A), two or more kinds of mutually different lower alkoxy-alkyl groups having a straight-chain or branched alkyl group are used.

As the component (A), a mixed resin obtained by mixing two or more kinds of polyhydroxystyrenes each having a different lower alkoxy-alkyl group, or a copolymer containing two or more kinds of mutually different hydroxystyrene units having a lower alkoxy-alkyl group can be used.

As the mixed resin, there can be used a mixture containing a first polyhydroxystyrene in which at least a portion of hydrogen atoms of hydroxyl groups are substituted with a first lower alkoxy-alkyl group and a second polyhydroxystyrene in which at least a portion of hydrogen atoms of hydroxyl groups are substituted with a second lower alkoxy-alkyl group which is different from the first lower alkoxy-alkyl group.

As the copolymer, there can be used polyhydroxystyrene containing a first hydroxystyrene unit in which at least a portion of hydrogen atoms of hydroxyl groups are substituted with the first lower alkoxy-alkyl group and a second hydroxystyrene unit in which at least a portion of hydrogen atoms of hydroxyl groups are substituted with the second lower alkoxy-alkyl group which is different from the first lower alkoxy-alkyl group.

The alkoxy group included in the lower alkoxy-alkyl group preferably has 5 or less carbon atoms, and also the alkyl group preferably has 5 or less carbon atoms.

In the component (A), in the case in which at least one kind of these lower alkoxy-alkyl groups is a lower alkoxy-alkyl group having a straight-chain alkoxy group (hereinafter an alkoxy-alkyl group having a straight-chain alkoxy group is referred to as a "straight-chain alkoxy-alkyl group", while an alkoxy-alkyl group having a straight-chain alkoxy group being combined with carbon at the 1-position of the alkyl group is referred to as a "1-straight-chain alkoxy-alkyl group") and at least one kind of other lower alkoxy-alkyl groups is a branched lower alkoxy-alkyl group (hereinafter an alkoxy-alkyl group having a branched alkoxy group is referred to as a "branched alkoxy-alkyl group", while an alkoxy-alkyl group having a branched alkoxy group being combined with carbon at the 1-position of the alkyl group is referred to as a "1-branched alkoxy-alkyl group"), the resist pattern profile and the resolution can be improved with good balance and, therefore, it is preferred.

Examples of the component (A) include the mixed resin or copolymer in which the first lower alkoxy-alkyl group is a lower straight-chain alkoxy-alkyl group and the second lower alkoxy-alkyl group is a lower branched alkoxy-alkyl group.

Examples of the lower straight-chain alkoxy-alkyl group include one, two or more kinds selected from the group consisting of 1-ethoxyethyl group, 1-methoxy-1-methylethyl group, 1-methoxypropyl group and 1-n-butoxyethyl group.

Examples of the lower branched alkoxy-alkyl group include one, two or more kinds selected from the group consisting of 1-isopropoxyethyl group, 1-isobutoxyethyl group and 1-sec-butoxyethyl group.

The component (A) preferably contains:

(A1) polyhydroxystyrene in which at least a portion of hydrogen atoms of hydroxyl groups are substituted with a 1-straight-chain alkoxy-alkyl group, and (A2) polyhydroxystyrene in which at least a portion of hydrogen atoms of hydroxyl groups are substituted with a 1-branched alkoxy-alkyl group.

Examples of the 1-straight-chain alkoxy-alkyl group include the same groups as those listed as the above lower straight-chain alkoxy-alkyl group.

Examples of the 1-branched alkoxy-alkyl group include the same groups as those listed as the above lower branched alkoxy-alkyl group.

Examples of the polyhydroxystyrene used in the component (A) include those containing:

(a1) a hydroxystyrene unit, and (a2) a unit in which hydrogen atoms of hydroxyl groups of the hydroxystyrene are substituted with a lower alkoxy-alkyl group.

The unit (a1) is a unit which imparts alkali solubility and adhesion to the substrate and is derived through cleavage of an ethylenic double bond of or hydroxy a-methylstyrene.

The position of the hydroxyl group may be the o-position, m-position or p-position, and most preferably the p-position in view of availability and low cost.

The unit (a2) is a portion which makes the component (A) alkali-soluble from alkali-insoluble by exposure.

When the chemical amplification type positive resist composition applied on the base material is irradiated with predetermined radiation, an acid is generated from an acid generating agent as the component (B) and the acid-dissociable dissolution inhibiting group of the unit (a2) is eliminated by an action of the acid, and thus the eliminated portion is converted into a phenolic hydroxyl group. As a result, the component (A), which was alkali-insoluble before the exposure, is made to be alkali-soluble after the exposure.

The polyhydroxystyrene used in the component (A) may contain a copolymerizable unit other than the units (a1) and (a2), and is preferably composed of the units (a1) and (a2) in view of suppression of resist residue.

The weight-average molecular weight of the component (A) is preferably within a range from 3000 to 30000, and more preferably from 5000 to 15000. When the weight-average molecular weight is less than 3000, the resulting composition is inferior in film-forming properties. On the other hand, when it exceeds 30000, it becomes difficult to dissolve in an alkali solution, particularly an aqueous alkali solution.

In the component (A), 10 to 60%, preferably 15 to 50%, of hydrogen atoms of hydroxyl groups in polyhydroxystyrene are preferably substituted with each of lower alkoxy-alkyl groups (lower alkoxy-alkyl group having a straight-chain alkoxy group and lower alkoxy-alkyl group having a branched alkoxy group). When the proportion is less than 10%, the dissolution in the alkali solution, particularly the aqueous alkali solution, is not sufficiently suppressed. On the other hand, when it exceeds 60%, it becomes difficult to dissolve in the alkali solution, particularly the aqueous alkali solution.

The component (A) preferably contains:

(A1') polyhydroxystyrene having a weight-average molecular weight within a range from 3000 to 30000 and a dispersion degree (number-average molecular weight/ weight-average molecular weight) within a range from 1.0 to 6.0 in which 10 to 60% of hydrogen atoms of hydroxyl groups of polyhydroxystyrene are substituted with a 1-straight-chain alkoxy-alkyl group (particularly 1-ethoxyethyl group), and (A2') polyhydroxystyrene having a weight-average molecular weight within a range from 3000 to 30000 and a dispersion degree (number-average molecular weight/weight-average molecular weight) within a range from 1.0 to 6.0 in which 10 to 60% of hydrogen atoms of hydroxyl groups of polyhydroxystyrene are substituted with a 1-branched alkoxy-alkyl group (particularly 1-isopropoxyethyl group) because of excellent resolution and excellent resist pattern profile.

When the dispersion degree exceeds 6.0, the resolution and the resist pattern profile are lowered and, therefore, it is not preferred.

In order to prevent trailing of the resist pattern and to achieve high resolution, it is preferred to use a mixture obtained by mixing (A1), namely, polyhydroxystyrene in which at least a portion of hydrogen atoms of hydroxyl groups are substituted with the 1-straight-chain alkoxy-alkyl group (particularly 1-ethoxyethyl group) with (A2), namely, polyhydroxystyrene in which at least a portion of hydrogen atoms of hydroxyl groups are substituted with the 1-branched alkoxy-alkyl group (particularly 1-isopropoxyethyl group) in a weight ratio within a range from 1:9 to 9:1, and preferably from 5:5 to 1:9.

When the mixing ratio of these two kinds of polyhydroxystyrenes deviates from the above range, the resolution and the resist pattern profile are lowered and, therefore, it is not preferred.

When using the component (A) with such a composition, the alkali solubility is easily enhanced by irradiation with radiation and a problem such as resist residue can be accurately solved.

In the component (A), the retention rate of the acid-dissociable dissolution inhibiting group after a dissociation test using hydrochloric acid is 40% or less, and preferably 30% or less.

When the retention rate exceeds 40%, resist residue is likely to be produced and, therefore, it is not preferred.

The dissociation test using hydrochloric acid is defined in the same manner as in case of the dissociation test using hydrochloric acid of the component (A) of the first chemical amplification type positive resist composition.

Regarding (ii) component (B), (iii) other components, and (iv) form of chemical amplification type positive resist composition used to form a resist pattern, almost the same descriptions as those in the case of the above first chemical amplification type resist composition can be stated.

The first or second chemical amplification type positive resist composition of the present invention is suited for use in the manufacture of semiconductor devices by a via-first dual damascene method.

(3) Base Material

In the present invention, the base material, which is used in the resist laminated material and is also used to form a resist pattern is preferably composed of a substrate, and a first interlaminar insulating layer, an etching stopper layer and a second interlaminar insulating layer laminated in that order on the substrate.

As the substrate, a substrate used commonly in the manufacture of semiconductor devices can be used and, for example, a silicon wafer is used.

An insulating film made of a low dielectric constant material is used in the first interlaminar insulating layer and the second interlaminar insulating layer. As used herein, the low dielectric constant material is preferably a material having a dielectric constant of 3.0 or less because it is is used for manufacturing through the dual damascene method.

These first and second interlaminar insulating layers can be formed, for example, by a CVD method, an organic or inorganic SOG method, or a rotary coating method of an organic polymer.

Examples of the first and second interlaminar insulating layers include silicon oxide layer obtained by the plasma CVD method (specifically, "BLACK DIAMOND" manufactured by Applied Materials Inc. and "CORAL" manufactured by Novellus Inc. may be mentioned); a hydrogen-containing silicon oxide layer having a Si—H group obtained by combining silicon of a silicon oxide layer with a hydrogen atom; polyimide film; benzocyclobutene polymer film; alkyl group-containing silicon oxide film obtained by combining a silicon atom in a silicon oxide layer with an alkyl group such as a methyl group; fluorine-containing silicon oxide layer; fluorine base resin film; mixture film made of a silicon porous material and a fluorine base resin; arylene ether polymer film; mixture film made of a fluorine base resin and a siloxane base resin; polyquinoline base resin film; polyquinoline base resin film; and fullerene film.

Among these films, a silicon oxide film is preferred because of excellent practicability.

The etching stopper layer is formed to prevent excess etching in the case of etching wiring grooves or via holes with high accuracy.

Preferred examples of the etching stopper layer include those obtained by forming materials such as silicon nitride (SiN), silicon carbide (SiC) or tantalum nitride (TaN) into a film by the CVD method.

The thickness of the first and second interlaminar insulating layers is within a range from 100 to 300 nm, and preferably from 200 to 300 nm.

The thickness of the etching stopper layer is within a range from 50 to 120 nm, and preferably from 50 to 100 nm.

The base material used in the present invention can be provided with a hard mask layer made of carbo-oxidated silicon (SiOC) or silicon nitride (SiN) on the second interlaminar insulating layer according to the purposes. When the hard mask layer is provided, the effect of preventing excess etching can be obtained.

The thickness of the hard mask layer is within a range from 50 to 120 nm, and preferably from 500 to 100 nm.

In the present invention, the following base materials can be used.

In the above base material, the etching stopper layer sometimes increases the dielectric constants of the first and second interlaminar insulating films provided thereon and thereunder to cause a problem according to the purposes. In that case, a base material obtained by providing a single-layer structure interlaminar insulating film and the same hard mask layer as described above on a substrate without providing the etching stopper layer can be used. The thickness of the single-layer structure interlaminar insulating film is within a range from 300 to 700 nm, and preferably from 400 to 600 nm. The dielectric constant of the interlaminar insulating layer is preferably 3.0 or less and the interlaminar insulating layer is preferably made of the silicon oxide layer because of excellent practicability.

(4) Resist Laminated Material

The resist laminated material of the present invention is obtained by applying the first or second chemical amplification type positive resist composition prepared as described above on the base material to form a coating layer. The thickness of the coating layer is within a range, for example, from 0.3 to 0.7 μm.

The laminated material is preferably a resist laminated material obtained by providing the coating layer made of the first or second chemical amplification type positive resist composition of the present invention on the base material obtained by laminating the first interlaminar insulating film, the etching stopper and the second interlaminar insulating film in sequence.

Alternatively, it can be a resist laminated material in which an organic film is provided between the base material and the resist coating layer. The organic film is a film formed by applying a composition for forming an organic film and exerts an effect of smoothening the base material and preventing reflection from the base material, or serves as an etching stopper layer, as is described in detail in the following resist pattern forming method (5).

(5) Resist Pattern Forming Method

The resist pattern can be formed in the following procedure.

The resist laminated material is prepared and then heated by irradiating with radiation from the coating layer side through a desired mask pattern according to a normal method. Then, the exposed resist laminated-material is developed using an alkali developing solution, for example, an aqueous 0.1 to 10 wt % solution of tetrahydroammonium hydroxide. As a result, the exposed portion is dissolved in the alkali developing solution, and thus a resist pattern faithful to a mask pattern can be formed.

As the radiation, KrF or ArF excimer laser is generally used and also radiation having a shorter wavelength such as an $F_2$ laser, EUV (extreme ultraviolet light), VUV (vacuum ultraviolet light), electron beam, X-ray or soft X-ray can be used.

If necessary, an organic film can be formed before irradiation with radiation by applying the composition for forming an organic film on the base material and under the coating layer of the chemical amplification type positive resist composition. The organic film is made of an organic compound having film-forming properties and exerts the effect of smoothening the base material and preventing reflection from the base material, or serves as an etching stopper layer of a via innermost layer in the case of forming a trench.

The organic film can be formed by the following procedure. Herein, an organic film having an ability to prevent organic reflection will be described.

An amino crosslinking agent in which at least two hydrogen atoms of amino groups are substituted with either or both of a methylol group and a lower alkoxymethyl group, for example, benzoguanamine, melamine or urea, and an acidic compound are dissolved in an organic solvent to prepare a composition for forming an anti-reflection film. The resulting composition for forming an anti-reflection film is applied on a base material, dried, and then heated at 100 to 300° C. to obtain an organic anti-reflection film.

Examples of the acidic compound include organic acid such as sulfuric acid, sulfurous acid or thiosulfuric acid; organic sulfonic acid; organic sulfonate ester; and an acid generating agent capable of generating an acid by activating light.

A particularly preferred organic film to be applied to the present invention is formed of a composition for forming an organic film in which the proportion of an oligomer such as trimer, dimer, or monomer of an amino crosslinking agent is controlled to 15% by weight or less based on the amino crosslinking agent.

The thickness of the organic film is within a range from 0.03 to 0.5 μm.

(6) Method of Manufacturing Semiconductor Device

The method of manufacturing the semiconductor device of the present invention can be conducted, for example, by applying the above-described resist pattern forming method in the manufacture of the semiconductor device using a via-first dual damascene method.

For example, a base material obtained by laminating a first interlaminar insulating layer, an etching stopper layer and a second interlaminar insulating layer in sequence on a substrate is prepared. The first or second chemical amplification type positive resist composition of the present invention is applied on the base material and the coated base material is exposed through a mask pattern (selective exposure), thereby to make the exposed portion alkali-soluble, and then the exposed portion is removed (developed) with an alkali developing solution. Thus, a pattern faithful to the mask pattern can be formed. The lower layer as the portion with no resist pattern is etched to form via holes which penetrate the first interlaminar insulating layer, the etching stopper layer and the second interlaminar insulating layer. Then, the first or second chemical amplification type positive resist composition containing the components (A) and (B) is further applied and the coated one is selectively exposed, thereby to make the exposed portion alkali-soluble. The exposed portion is removed with an alkali developing solution to form a resist pattern and the lower layer with no resist pattern is etched to widen the groove width of the via holes formed on the second interlaminar insulating layer, thereby to form wiring grooves.

When an organic film is formed at the lower portion in the via holes formed in the first interlaminar insulating layer so as to ensure the same level as that of the bottom portion of the wiring grooves formed at the upper portion of the first interlaminar insulating layer and the chemical amplification type positive resist composition is applied, followed by exposure and further development in the same manner as described above, and then the wiring grooves are etched, excess etching can be prevented by the organic film and, therefore, it is preferred.

In the case in which the organic film is formed in the via holes, the organic film is removed and, finally, copper is embedded in the via holes formed in the first interlaminar insulating layer and the wiring grooves formed on the second interlaminar insulating layer on the first interlaminer insulating layer via the etching stopper layer, thereby to complete wiring, and thus a semiconductor device is obtained.

When using a base material obtained by laminating an insulating layer and a hard coat layer in sequence on a substrate, after forming via holes which penetrate the insulating layer and the hard coat layer, an organic film is preferably formed at the lower portion in the via holes in the same manner and a chemical amplification type positive resist composition is applied. The coated one is subjected to selective exposure and alkali-developed to form a resist pattern, and then etching is conducted to widen the groove width of the upper portion of the via holes, thereby to form wiring grooves. In the case in which an organic film is formed in the wiring grooves, the organic film is removed and copper is embedded in these via holes and wiring grooves, and thus a semiconductor device can be manufactured.

EXAMPLES

The present invention will now be described in detail by way of Examples. Various physical properties in the following Examples were determined in the following procedures.

(1) Retention Rate of Acid-Dissociable Dissolution Inhibiting Group

10 Parts by weight of the component (A) is dissolved in 90 parts by weight of propylene glycol monomethyl ether acetate to prepare a solution having a concentration of 10% by weight. To the resulting solution, 10 parts by weight of hydrochloric acid having a concentration of 10% by weight is added to prepare a uniform solution, which is stirred at 23° C. for 10 minutes, thereby to dissociate an acid-dissociable dissolution inhibiting group. The substitution rate of the acid-dissociable dissolution inhibiting group before and after the acid treatment is measured by a $^{13}$C-NMR method. The retention rate (of the acid-dissociable dissolution inhibiting group) is determined from the measured value by the equation described hereinabove.

(2) Sensitivity

To form wiring grooves at the upper portion of via holes of a base material provided with via holes described hereinafter, the base material was exposed to light through a predetermined photomask using a minifying projection exposure machine (Model FPA-3000EX3, manufactured by Canon Co.) while increasing a dose by 1 mJ/cm$^2$ and subjected to PEB (post-exposure baking) at 110° C. for 60 seconds, followed by development in an aqueous 2.38 wt % solution of tetramethylammonium hydroxide at 23° C. for 30 seconds, washing with water for 30 seconds and further drying. Then, the exposure time, which ensures a ratio of a resist pattern of 0.25 μm or 0.18 μm shown in Table 1 and Table 2 to a space pattern of 1:1, was measured as the sensitivity. The measured value was indicated by the amount of energy exposed (mJ/cm$^2$).

(3) Presence or Absence of Resist Residue on Via Holes

It was examined whether or not resist residue was produced on via holes by observing a SEM (scanning electron microscope) micrograph of a resist pattern with line-and-space (0.25 μm or 0.18 μm described in Table 1 and Table 2) obtained by the same operation as in (2) was observed. Samples where no resist residue was observed were rated "○", samples where slight resist residue was observed were rated "Δ", and samples where severe resist residue was observed were rated "×".

(4) Resolution

The limiting resolution of the line-and-space pattern obtained by the same operation as in (2) was examined.

(5) Cross Sectional Profile of Resist Pattern

The cross sectional profile of the line-and-space pattern obtained in (3) was observed from the SEM micrograph. Samples which exhibit a rectangular pattern or nearly rectangular pattern were rated "A", while samples which exhibit a pattern having a round top portion (in the form of a curve) were rated "B".

(Formation of Base Material and Via Holes)

After forming a first silicon oxide film (first interlaminar insulating layer having a dielectric constant of 2.7) on a silicon wafer by a plasma CVD method, a thin film (etching stopper layer) made of SiN was provided by a CVD method and a second silicon oxide film (second interlaminar insulating layer having a dielectric constant of 2.7) was further provided thereon by the plasma CVD method to prepare a base material.

Then, via holes, which penetrate the first silicon oxide film, the SiN film and the second silicon oxide film, were formed.

Example 1

After forming a first silicon oxide film (first interlaminar insulating layer having a dielectric constant of 2.7) on a silicon wafer by the plasma CVD method, a thin film (etching stopper layer) made of SiN was provided by the CVD method and a second silicon oxide film (second interlaminar insulating layer having a dielectric constant of 2.7) was further provided thereon by the plasma CVD method to prepare a base material.

Then, the following components (A) and (B) were prepared.

Component (A): 100 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): 10 parts by weight of bis(isopropylsulfonyl)diazomethane To these components (A) and (B), 0.40 parts by weight of triisopropanolamine as an amine was added and they were dissolved in 500 parts by weight of propylene glycol monomethyl etheracetate as a solvent, and then the resulting solution was filtered through a membrane filter (pore diameter: 0.2 μm) to prepare a coating solution of a chemical amplification type positive resist composition.

The coating solution was applied on the base material prepared as described above using a spinner and dried on a hot plate at 90° C. for 60 seconds to form a resist film having a thickness of 0.53 μm, and thus a resist laminated material was prepared.

Example 2

The following components (A) and (B) were prepared.

Component (A): 100 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): 10 parts by weight of bis(isopropylsulfonyl)diazomethane To these components (A) and (B), 0.40 parts by weight of triisopropanolamine as an amine was added and they were dissolved in 500 parts by weight of propylene glycol monomethyl etheracetate as a solvent, and then the resulting solution was filtered through a membrane filter (pore diameter: 0.2 μm) to prepare a coating solution of a chemical amplification type positive resist composition.

Then, an organic film (manufactured by Tokyo Ohka Kogyo Co., Ltd., under the trade name of SWK-EX9) having a thickness of 110 nm was formed at the lower portion in via holes of the base material prepared as described above.

The coating solution was applied thereon using a spinner and dried on a hot plate at 90° C. for 60 seconds to form a resist film having a thickness of 0.53 μm, and thus a resist laminated material was prepared. As described in (2), the resist laminated material was exposed to light through a predetermined mask and subjected to PEB, and then a resist film of the exposed portion was removed with an alkali developing solution to form a resist pattern. The second silicon oxide film formed thereunder was etched to form wiring grooves.

Physical properties of the resulting semiconductor device are shown in Table 1.

Example 3

In the same manner as in Example 2, except that the following components (A) and (B) are different from those in Example 2, a semiconductor device was manufactured. Physical properties thereof are shown in Table 1.

Component (A): 100 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group Component (B): 15 parts by weight of bis(isopropylsulfonyl)diazomethane Example 4

In the same manner as in Example 2, except that the following components (A) and (B) are different from those in Example 2, a semiconductor device was manufactured. Physical properties thereof are shown in Table 1.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane and 10 parts by weight of bis(tert-butylsulfonyl)diazomethane Example 5

In the same manner as in Example 2, except that the following components (A) and (B) are different from those in Example 2, a semiconductor device was manufactured. Physical properties thereof are shown in Table 1.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane, 10 parts by weight of bis(tert-butylsulfonyl)diazomethane and 0.5 parts by weight of bis(4-tertbutylphenyl)iodoniumtrifluoromethane sulfonate Example 6

In the same manner as in Example 2, except that the following components (A) and (B) are different from those in Example 2, a semiconductor device was manufactured. Physical properties thereof are shown in Table 1.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane, 10 parts by weight of bis(tert-butylsulfonyl)diazomethane, 0.5 parts by weight of bis(4-tertbutylphenyl)iodoniumtrifluoromethane sulfonate and 0.5 parts by weight of the compound represented by the chemical formula (1)

Comparative Example 1

In the same manner as in Example 2, except that the following was used as the component (A), a semiconductor device was manufactured. Physical properties thereof are shown in Table 1.

Component (A): mixture of 30 parts by weight of polyhydroxystyrene having a weight-average molecular weight of 8000 and a dispersion degree of 1.2 in which 35% of hydrogen atoms of existing hydroxyl groups are substituted with a tert-butoxycarbonyl group and 70 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 2

In the same manner as in Example 2, except that the following was used as the component (A), a semiconductor device was manufactured. Physical properties thereof are shown in Table 1.

Component (A): mixture of 30 parts by weight of polyhydroxystyrene having a weight-average molecular weight of 8000 and a dispersion degree of 1.2 in which 30% of hydrogen atoms of existing hydroxyl groups are substituted with a tert-butyl group and 70 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 3

In the same manner as in Example 2, except that the following was used as the component (A), a semiconductor device was manufactured. Physical properties thereof are shown in Table 1.

Component (A): mixture of 20 parts by weight of polyhydroxystyrene having a weight-average molecular weight of 8000 and a dispersion degree of 1.2 in which 35% of hydrogen atoms of existing hydroxyl groups are substituted with a tetrahydropyranyl group and 80 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 4

In the same manner as in Example 2, except that the following was used as the component (A), a semiconductor device was manufactured. Physical properties thereof are shown in Table 1.

Component (A): 100 parts by weight of polyhydroxystyrene having a weight-average molecular weight of 8000 and a dispersion degree of 1.2 in which 35% of hydrogen atoms of existing hydroxyl groups are substituted with a tert-butoxycarbonyl group Comparative Example 5

In the same manner as in Example 2, except that the following was used as the component (A), a semiconductor device was manufactured. Physical properties thereof are shown in Table 1.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a tetrahydropyranyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group

TABLE 1

| | | Retention rate (%) of acid-dissociable dissolution inhibiting agent | Sensitivity ($mJ/cm^2$) | Presence or absence of resist residue | Resolution (μm) |
|---|---|---|---|---|---|
| Examples | 2 | 29 | 42 (0.25 μm) | ○ | 0.18 |
| | 3 | 29 | 45 (0.25 μm) | ○ | 0.18 |
| | 4 | 29 | 42 (0.25 μm) | ○ | 0.18 |
| | 5 | 29 | 39 (0.18 μm) | ○ | 0.15 |
| | 6 | 29 | 35 (0.18 μm) | ○ | 0.15 |
| Comparative Examples | 1 | 100 | 41 (0.25 μm) | Δ | 0.18 |
| | 2 | 100 | 40 (0.25 μm) | X | 0.18 |
| | 3 | 57 | 45 (0.25 μm) | Δ | 0.18 |
| | 4 | 100 | not resolvable (0.25 μm) | impossible to evaluate | not resolvable |
| | 5 | 57 | 52 (0.25 μm) | X | 0.20 |

In Table 1, in the case in which the component (A) is a mixture of two kinds and has two kinds of acid-dissociable dissolution inhibiting groups, a higher retention rate of the acid-dissociable dissolution inhibiting group was described.

As is apparent from the results shown in the table, no resist residue was observed in the Examples using the component (A) in which the retention rate of the acid-dissociable dissolution inhibiting group is 40% or less of the present invention and thus the effects of the present invention were made clear. In contrarst, resist residue was observed in the Comparative Examples, though there was some difference.

Example 7

After forming a first silicon oxide film (first interlaminar insulating layer having a dielectric constant of 2.7) on a silicon wafer by the plasma CVD method, a thin film (etching stopper layer) made of SiN was provided by the CVD method and a second silicon oxide film (second interlaminar insulating layer having a dielectric constant of 2.7) was further provided thereon by the plasma CVD method to prepare a base material.

Then, the following components (A) and (B) were prepared.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane, 10 parts by weight of bis(tert-butylsulfonyl)diazomethane, 0.5 parts by weight of bis(4-tertbutylphenyl)iodoniumtrifluoromethane sulfonate and 0.5 parts by weight of the compound represented by the chemical formula (1)

To these components (A) and (B), 0.40 parts by weight of triisopropanolamine as an amine was added and they were dissolved in 500 parts by weight of propylene glycol monomethyl etheracetate as a solvent, and then the resulting solution was filtered through a membrane filter (pore diameter: 0.2 μm) to prepare a coating solution of a chemical amplification type positive resist composition.

The coating solution was applied-on the base material prepared as described above using a spinner and dried on a hot plate at 90° C. for 60 seconds to form a resist film having a thickness of 0.53 μm, and thus a resist laminated material was prepared.

Example 8

The following components (A) and (B) were prepared.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane, 10 parts by weight of bis(tert-butylsulfonyl)diazomethane, 0.5 parts by weight of bis(4-tertbutylphenyl)iodoniumtrifluoromethane sulfonate and 0.5 parts by weight of the compound represented by the chemical formula (1)

To these components (A) and (B), 0.40 parts by weight of triisopropanolamine as an amine was added and they were dissolved in 500 parts by weight of propylene glycol monomethyl etheracetate as a solvent, and then the resulting solution was filtered through a membrane filter (pore diameter: 0.2 μm) to prepare a coating solution of a chemical amplification type positive resist composition.

Then, an organic film (manufactured by Tokyo Ohka Kogyo Co., Ltd. under the trade name of SWK-EX9) having a thickness of 110 nm was formed at the lower portion in via holes of the base material prepared as described above.

The coating solution was applied thereon using a spinner and dried on a hot plate at 90° C. for 60 seconds to form a resist film having a thickness of 0.53 μm, and thus a resist laminated material was prepared. As described in (2), the resist laminated material was exposed to light through a predetermined mask and subjected to PEB, and then a resist film of the exposed portion was removed with an alkali developing solution to form a resist pattern. The second silicon oxide film formed thereunder was etched to form wiring grooves.

Physical properties of the resulting semiconductor device are shown in Table 2.

Example 9

In the same manner as in Example 8, except that the following components (A) and (B) are used, a semiconductor device was manufactured. Physical properties thereof are shown in Table 2.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane, 10 parts by weight of bis(tert-butylsulfonyl)diazomethane and 0.5 parts by weight of bis(4-tertbutylphenyl)iodoniumtrifluoromethane sulfonate Example 10

In the same manner as in Example 8, except that the following components (A) and (B) are used, a semiconductor device was manufactured. Physical properties thereof are shown in Table 2.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Component (B): mixture of 5 parts by weight of bis(isopropylsulfonyl)diazomethane and 10 parts by weight of bis(tert-butylsulfonyl)diazomethane Example 11

In the same manner as in Example 8, except that the following components (A) and (B) are used, a semiconductor device was manufactured. Physical properties thereof are shown in Table 2.

Component (A): 100 parts by weight of polyhydroxystyrene having a weight-average molecular weight of 8000 and a dispersion degree of 1.2 in which 35% of hydrogen atoms of existing hydroxyl groups are substituted with a 1-ethoxyethyl group Component (B): 15 parts by weight of bis(isopropylsulfonyl)diazomethane Comparative Example 6

In the same manner as in Example 11, except that the following was used as the component (A), a semiconductor device was manufactured. Physical properties thereof are shown in Table 2.

Component (A): mixture of 30 parts by weight of polyhydroxystyrene having a weight-average molecular weight of 8000 and a dispersion degree of 1.2 in which 35% of hydrogen atoms of existing hydroxyl groups are substituted with a tert-butoxycarbonyl group and 70 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 7

In the same manner as in Example 11, except that the following was used as the component (A), a semiconductor device was manufactured. Physical properties thereof are shown in Table 2.

Component (A): mixture of 30 parts by weight of polyhydroxystyrene having a weight-average molecular weight of 8000 and a dispersion degree of 1.2 in which 30% of hydrogen atoms of existing hydroxyl groups are substituted with a tert-butyl group and 70 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 8

In the same manner as in Example 11, except that the following was used as the component (A), a semiconductor device was manufactured. Physical properties thereof are shown in Table 2.

Component (A): mixture of 20 parts by weight of polyhydroxystyrene having a weight-average molecular weight of 8000 and a dispersion degree of 1.2 in which 35% of hydrogen atoms of existing hydroxyl groups are substituted with a tetrahydropyranyl group and 80 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group Comparative Example 9

In the same manner as in Example 11, except that the following was used as the component (A), a semiconductor device was manufactured. Physical properties thereof are shown in Table 2.

Component (A): 100 parts by weight of polyhydroxystyrene having a weight-average molecular weight of 8000 and a dispersion degree of 1.2 in which 35% of hydrogen atoms of existing hydroxyl groups are substituted with a tert-butoxycarbonyl group Comparative Example 10

In the same manner as in Example 11, except that the following was used as the component (A), a semiconductor device was manufactured. Physical properties thereof are shown in Table 2.

Component (A): mixture of 50 parts by weight of polyhydroxystyrene having a weight-average molecular weight of 8000 and a dispersion degree of 1.2 in which 35% of hydrogen atoms of existing hydroxyl groups are substituted with a tetrahydropyranyl group and 50 parts by weight of polyhydroxystyrene having a weight-average molecular weight of 8000 and a dispersion degree of 1.2 in which 35% of hydrogen atoms of existing hydroxyl groups are substituted with a 1-isopropoxyethyl group

TABLE 2

| | Acid-dissociable dissolution inhibiting group | Sensitivity (mJ/cm$^2$) | Presence or absence of resist residue | Resolution (μm) | Retention rate (%) | Cross sectional profile of resist pattern |
|---|---|---|---|---|---|---|
| Example 8 | 1-ethoxyethyl group<br>1-isopropoxyethyl group | 35<br>(0.18 μm) | ○ | 0.15 | 29 | A |
| Example 9 | 1-ethoxyethyl group<br>1-isopropoxyethyl group | 39<br>(0.18 μm) | ○ | 0.15 | 29 | A |
| Example 10 | 1-ethoxyethyl group<br>1-isopropoxyethyl group | 42<br>(0.25 μm) | ○ | 0.18 | 29 | A |
| Example 11 | 1-ethoxyethyl group | 45<br>(0.25 μm) | ○ | 0.18 | 29 | B |
| Comparative Example 6 | tert-butoxycarbonyl group<br>1-isopropoxyethyl group | 41<br>(0.25 μm) | Δ | 0.18 | 100 | A |
| Comparative Example 7 | tert-butyl group<br>1-isopropoxyethyl group | 40<br>(0.25 μm) | X | 0.18 | 100 | A |
| Comparative Example 8 | tetrahydropyranyl group<br>1-isopropoxyethyl group | 45<br>(0.25 μm) | Δ | 0.18 | 57 | A |
| Comparative Example 9 | tert-butoxycarbonyl group | not resolvable<br>(0.25 μm) | impossible to evaluate | not resolvable | 100 | — |
| Comparative Example 10 | tetrahydropyranyl group<br>1-isopropoxyethyl group | 52<br>(0.25 μm) | X | 0.20 | 57 | A |

As is apparent from the results shown in Table 2, Examples 8 to 10 using two or more kinds of mutually different straight-chain or branched lower alkoxy-alkyl groups as the component (A) are superior in sensitivity and cross sectional profile of the resist pattern to Example 11 and are also superior in sensitivity, resolution, presence of absence of resist residue and cross sectional profile of the resist pattern to the Comparative Examples.

INDUSTRIAL APPLICABILITY

According to the present invention, there can be provided a chemical amplification type positive resist composition which can give a high-resolution resist pattern capable of coping with fine pattern required to the manufacture of semiconductor devices by a via-first dual damascene method without producing resist residue, a resist pattern forming method, and a method of manufacturing a semiconductor device using the same.

What is claimed is:

1. A chemical amplification type positive resist composition comprising the following components (A) and (B):

(A) polyhydroxystyrene in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, and wherein the component (B) comprises bisalkylsulfonyldiazomethane as a main component, and comprises an onium salt in an amount of 2 to 5% by weight based on the bisalkylsulfonyldiazomethane.

2. The chemical amplification type positive resist composition according to claim 1, wherein the acid-dissociable dissolution inhibiting group of the component (A) is a lower alkoxy-alkyl group.

3. The chemical amplification type positive resist composition according to claim 1, wherein the component (A) is polyhydroxystyrene comprising:

($a_1$) a hydroxystyrene unit, and ($a_2$) a hydroxystyrene unit in which at least a portion of hydrogen atoms of hydroxyl groups are substituted with a lower alkoxy-alkyl group.

4. The chemical amplification type positive resist composition according to claim 1, wherein the bisalkylsulfonyldiazomethane is bis(isopropylsulfonyl)diazomethane, bis(tert-butylsulfonyl)diazomethane or a mixture thereof.

5. The chemical amplification type positive resist composition according to claim 1, wherein a tertiary aliphatic amine is mixed with the chemical amplification type positive resist composition.

6. A resist laminated material comprising a base material obtained by laminating a first interlaminar insulating film layer, an etching stopper layer and a second interlaminar insulating layer in sequence, and a coating layer of chemical amplification type positive resist composition provided on the base material, said chemical amplification type positive resist composition comprising the following components (A) and (B):

(A) polyhydroxystyrene in which at least a portion of hydrogen atoms of hydroxyl groups are substituted with an acid-disssociable dissolution inhibiting group, and the solubility in an alkali solution of the polyhydroxystyrene increase when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, wherein the component (B) comprises bisalkylsulfonyldiazomethane as a main component, and comprises an onium salt in an amount of 2 to 5% by weight based on the bisalkylsulfonyldiazomethane.

7. A resist pattern forming method, which comprises applying a chemical amplification type positive resist composition on a base material and subjecting the coated base material to selective exposure and development in sequence to form a resist pattern, wherein the chemical amplification type positive resist composition is a chemical amplification type positive resist composition of claim 1.

8. A resist pattern forming method, which comprises applying a chemical amplification type positive resist composition on a base material and subjecting the coated base material to selective exposure and development in sequence to form a resist pattern, wherein the chemical amplification type positive resist composition comprises the following components (A) and (B);

(A) polyhydroxystyrene in which a least a portion of hydrogen atoms of hydroxyl groups are substituted with an acid-dissociable dissolution inhibiting group, and the solubility in an alkali solution of the polyhydroxystyrene increases when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after the dissociation test using hydrochloric acid is 40% or less, wherein the component (B) comprises bisalkylsulfonyldiazomethane as a main component, and comprises an onium salt in an amount of 2 to 5% by weight based on the bisalkylsulfonyldiazomethane, wherein the base material is obtained by laminating a first interlaminar insulating layer, an etching stopper layer and a second interlaminar insulating layer in sequence on a substrate.

9. The resist pattern forming method according to claim 8, wherein either or both of the first interlaminar insulating layer and the second interlaminar insulating layer are silicon oxide layers having a dielectric constant of 3.0 or less.

10. The resist pattern forming method according to claim 8, wherein the etching stopper layer is formed of silicon nitride, silicon carbide or tantalum nitride.

11. A resist pattern forming method, which comprises applying a chemical amplification type positive resist composition on a base material and subjecting the coated base material to selective exposure and development in sequence to form a resist pattern, wherein the chemical amplification type positive resist composition comprises the following components (A) and (B);

(A) polyhydroxystyrene in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, wherein the component (B) comprises bisalkylsulfonyldiazomethane as a main component, and comprises an onium salt in an amount of 2 to 5% by weight based on the bisalkylsulfonyldiazomethane, wherein the base material is obtained by laminating an insulating layer and a hard mask layer in sequence on a substrate.

12. The resist pattern forming method according to claim 11, wherein the insulating layer is a silicon oxide layer having a dielectric constant of 3.0 or less.

13. A method of manufacturing a semiconductor device using a via-first dual damascene method of forming via holes on a base material and forming wiring grooves at the upper portion, which comprises forming at least the wiring grooves by a resist pattern forming method, which comprises applying a chemical amplification type positive resist composition on a base material and subjecting the coated base material to selective exposure and development in sequence to form a resist pattern, wherein the chemical amplification type positive resist composition comprises the following components (A) and (B);

(A) polyhydroxystyrene in which at least a portion of hydrogen atoms of hydroxyl groups are substituted with an acid-dissociable dissolution inhibiting group, and the solubility in an alkali solution of the polyhydroxystyrene increasing when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, wherein the component (B) comprises bisalkylsulfonyldiazomethane as a main component, and comprises an onium salt in an amount of 2 to 5% by weight based on the bisalkylsulfonyldiazomethane.

14. The method of manufacturing the semiconductor device according to claim 13, wherein an organic film is formed at the lower portion of the via holes and then the wiring grooves are formed by the resist pattern forming method.

15. A method of manufacturing a semiconductor device using a via-first dual damascene method comprising applying a chemical amplification type positive resist composition comprising the following components (A) and (B):

(A) polyhydroxystyrene in which at least a portion of hydrogen atoms of hydroxyl groups are substituted with an acid-dissociable dissolution inhibiting group, and the solubility in an alkali solution of the polyhydroxystyrene increases when the acid-dissociable dissolution inhibiting group is eliminated by an action of an acid, and (B) a component capable of generating an acid by irradiation with radiation, wherein a retention rate of the acid-dissociable dissolution inhibiting group of the component (A) after a dissociation test using hydrochloric acid is 40% or less, wherein the component (B) comprises bisalkylsulfonyldiazomethane as a main component, and comprises an onium salt in an amount of 2 to 5% by weight based on the bisalkylsulfonyldiazomethane.

* * * * *